US011006201B2

(12) United States Patent
Kumar et al.

(10) Patent No.: US 11,006,201 B2
(45) **Date of Patent: *May 11, 2021**

(54) HEADPHONE OFF-EAR DETECTION

(71) Applicant: Avnera Corporation, Hillsboro, OR (US)

(72) Inventors: Amit Kumar, Portland, OR (US); Shankar Rathoud, Hillsboro, OR (US); Michael Jon Wurtz, Lake Oswego, OR (US); Eric Etheridge, Sherwood, OR (US); Eric Sorensen, Portland, OR (US)

(73) Assignee: AVNERA CORPORATION, Hillsboro, OR (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/588,108

(22) Filed: Sep. 30, 2019

(65) Prior Publication Data

US 2020/0137478 A1 Apr. 30, 2020

Related U.S. Application Data

(63) Continuation of application No. 16/174,067, filed on Oct. 29, 2018, now Pat. No. 10,448,140, which is a continuation of application No. 15/984,068, filed on May 18, 2018, now Pat. No. 10,200,776, which is a continuation of application No. 15/792,394, filed on Oct. 24, 2017, now Pat. No. 9,980,034.

(Continued)

(51) Int. Cl.

*H04R 1/10* (2006.01)
*H04R 29/00* (2006.01)

(Continued)

(52) U.S. Cl.

CPC ......... *H04R 1/1041* (2013.01); *G10K 11/178* (2013.01); *H04R 1/1008* (2013.01);

(Continued)

(58) Field of Classification Search

CPC ...... H04R 1/10; H04R 1/1041; H04R 1/1008; H04R 29/001; H04R 3/00; H04R 2460/01;

(Continued)

(56) References Cited

U.S. PATENT DOCUMENTS 8,699,719 B2 4/2014 Johnson, Jr. et al.
9,264,803 B1 * 2/2016 Johnson .................. G01S 15/04

(Continued)

FOREIGN PATENT DOCUMENTS

WO WO 2018/081154 5/2018

OTHER PUBLICATIONS

International Search Report and Written Opinion received in PCT Application No. PCT/US2017/058128, dated Feb. 7, 2018 in 11 pages.

*Primary Examiner* — Jason R Kurr
(74) *Attorney, Agent, or Firm* — Lando & Anastasi, LLP

(57) ABSTRACT

Disclosed is a signal processor for headphone off-ear detection. The signal processor includes an audio output to transmit an audio signal toward a headphone speaker in a headphone cup. The signal processor also includes a feedback (FB) microphone input to receive a FB signal from a FB microphone in the headphone cup. The signal processor also includes an off-ear detection (OED) signal processor to determine an audio frequency response of the FB signal over an OED frame as a received frequency response. The OED processor also determines an audio frequency response of the audio signal times an off-ear transfer function between the headphone speaker and the FB microphone as an ideal off-ear response. A difference metric si generated comparing the received frequency response to the ideal off-ear frequency response. The difference metric is employed to detect when the headphone cup is disengaged from an ear.

20 Claims, 8 Drawing Sheets

Related U.S. Application Data

(60) Provisional application No. 62/467,731, filed on Mar. 6, 2017, provisional application No. 62/412,206, filed on Oct. 24, 2016.

(51) Int. Cl.

| | |
|---|---|
| ***G10K 11/178*** | (2006.01) |
| ***H04R 3/00*** | (2006.01) |

(52) U.S. Cl.
CPC ............ *H04R 3/00* (2013.01); *H04R 29/001* (2013.01); *G10K 2210/1081* (2013.01); *G10K 2210/3026* (2013.01); *G10K 2210/3027* (2013.01); *H04R 2460/01* (2013.01)

(58) Field of Classification Search
CPC ... G10K 2210/1081; G10K 2210/3026; G10K 2210/3027; G10K 11/178
See application file for complete search history.

(56) References Cited

U.S. PATENT DOCUMENTS

| | | | | |
|---|---|---|---|---|
| 9,838,812 | B1 | 12/2017 | Shetye et al. | |
| 9,980,034 | B2 | 5/2018 | Kumar et al. | |
| 10,750,302 | B1 * | 8/2020 | Zhong | G06F 3/16 |
| 2008/0137873 | A1 * | 6/2008 | Goldstein | H04R 1/1083 381/57 |
| 2010/0189268 | A1 | 7/2010 | Haartsen et al. | |
| 2010/0246845 | A1 | 9/2010 | Burge | |
| 2014/0270223 | A1 | 9/2014 | Li et al. | |
| 2015/0010158 | A1 | 1/2015 | Broadley | |
| 2015/0078559 | A1 * | 3/2015 | Ilango | H03F 3/181 381/59 |
| 2015/0228292 | A1 | 8/2015 | Goldstein | |
| 2016/0300562 | A1 | 10/2016 | Goldstein | |
| 2016/0309270 | A1 | 10/2016 | Miller et al. | |
| 2017/0013345 | A1 | 1/2017 | Kumar et al. | |
| 2017/0339483 | A1 | 11/2017 | Ergezer et al. | |
| 2018/0270564 | A1 | 9/2018 | Kumar et al. | |

* cited by examiner

HEADPHONE OFF-EAR DETECTION

CROSS-REFERENCES TO RELATED APPLICATIONS

This patent application is a continuation of U.S. Non-provisional patent application Ser. No. 16/174,067, filed Oct. 29, 2018 and titled "HEADPHONE OFF-EAR DETECTION," which is a continuation of U.S. Non-provisional patent application Ser. No. 15/984,068, filed May 18, 2018 and titled "HEADPHONE OFF-EAR DETECTION," and which is a continuation of U.S. Non-provisional patent application Ser. No. 15/792,394, filed Oct. 24, 2017, entitled "Headphone Off-Ear Detection," which claims benefit from U.S. Provisional Patent Application No. 62/412,206 filed Oct. 24, 2016, entitled "Headphone Off Ear Detection," and which claims benefit from U.S. Provisional Patent Application No. 62/467,731 filed Mar. 6, 2017, entitled "Off Ear Detection," the disclosures of all of which are hereby incorporated herein by reference in their entirety.

BACKGROUND

Active noise cancellation (ANC) is a method of reducing an amount of undesired noise received by a user listening to audio through headphones. The noise reduction is typically achieved by playing an anti-noise signal through the headphone's speakers. The anti-noise signal is an approximation of the negative of the undesired noise signal that would be in the ear cavity in the absence of ANC. The undesired noise signal is then neutralized when combined with the anti-noise signal.

In a general noise-cancellation process, one or more microphones monitor ambient noise or residual noise in the ear cups of headphones in real-time, then the speaker plays the anti-noise signal generated from the ambient or residual noise. The anti-noise signal may be generated differently depending on factors such as physical shape and size of the headphone, frequency response of the speaker and microphone transducers, latency of the speaker transducer at various frequencies, sensitivity of the microphones, and placement of the speaker and microphone transducers, for example.

In feedforward ANC, the microphone senses ambient noise but does not appreciably sense audio played by the speaker. In other words, the feedforward microphone does not monitor the signal directly from the speaker. In feedback ANC, the microphone is placed in a position to sense the total audio signal present in the ear cavity. So, the microphone senses the sum of both the ambient noise as well as the audio played back by the speaker. A combined feedforward and feedback ANC system uses both feedforward and feedback microphones.

Typical ANC headphones are powered systems that require a battery or another power source to operate. A commonly encountered problem with powered headphones is that they continue to drain the battery if the user removed the headphones without turning them off.

While some headphones detect whether a user is wearing the headphones, these conventional designs rely on mechanical sensors, such as a contact sensor or magnets, to determine whether the headphones are being worn by the user. Those sensors would not otherwise be part of the headphone. Instead, they are an additional component, perhaps increasing the cost or complexity of the headphone.

The disclosed examples address these and other issues.

DETAILED DESCRIPTION

Figure 1A:
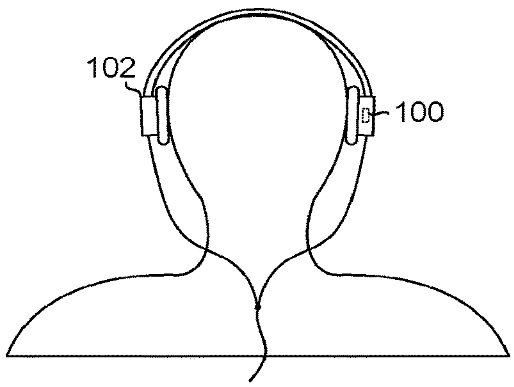
FIG. 1A shows an example of an off-ear detector integrated into a headphone, which is depicted on-ear.

Disclosed herein are devices, systems, and/or methods that employ headphone ANC components to perform OED. For example, a narrowband OED system may be employed. In the narrowband OED system, an OED tone is injected into an audio signal at a specified frequency bin. The OED tone is set at a sub-audible frequency so the end user is unaware of the tone. Due to constraints of the speaker when operating at low frequencies, the tone is present when played into the user's ear, but largely dissipates when the headphone is removed. Accordingly, a narrowband process can determine that a headphone has been removed when a feedback (FB) microphone signal at the specified frequency bin drops below a threshold. The narrowband process can also be determined as a component of a wideband OED system. In either case, a feedforward (FF) microphone may be employed to capture ambient noise. The OED system may determine a noise floor based on the ambient noise and adjust the OED tone to be louder than the noise floor. When the audio signal includes music, the wideband OED system may also be employed. The wideband OED system operates in the frequency domain. The wideband OED system determines a difference metric over a plurality of frequency bins. The difference metric is determined by removing ambient noise coupled between the FF and FB microphones from the FB microphone signal. The FB microphone signal is then compared to an ideal off-ear value based on a the audio signal and a transfer function describing an ideal change to the audio signal when the headphone is off-ear. The resulting value may also be normalized according to on an ideal on-ear value based on a the audio signal and a transfer function describing an ideal change to the audio signal when the headphone is on-ear. The frequency bins of the difference metric are then weighted, and the weights are employed to generate a confidence metric. The difference metric and the confidence metric are then employed to determine when the earphone has been removed. The difference metric may be averaged over an OED cycle and compared to a threshold. Successive difference metrics may also be compared, with rapid changes in values indicating a state change (e.g. from on-ear to off-ear and vice versa). A distortion metric may also be employed. The distortion metric supports allowing the OED system to distinguish between energy produced by non-linearities in the system from the energy produced by the desired signal. Phase of the signals may also be employed to avoid potential noise floor calculation errors related to wind noise in the FF microphone that is uncorrelated with the FB microphone.

In general, the devices, systems, and/or methods disclosed herein use at least one microphone in an ANC headphone as part of a detection system to acoustically determine if the headphone is positioned on a user's ear. The detection system does not typically include a separate sensor, such as a mechanical sensor, although in some examples a separate sensor could also be used. If the detection system determines that the headphones are not being worn, steps may be taken to reduce power consumption or implement other convenience features, such as sending a signal to turn off the ANC feature, turn off parts of the headphone, turn off the entire headphone, or pause or stop a connected media player. If the detection system instead determines that the headphones are being worn, such a convenience feature might include sending a signal to start or restart the media player. Other features may also be controlled by the sensed information.

Figure 1B:
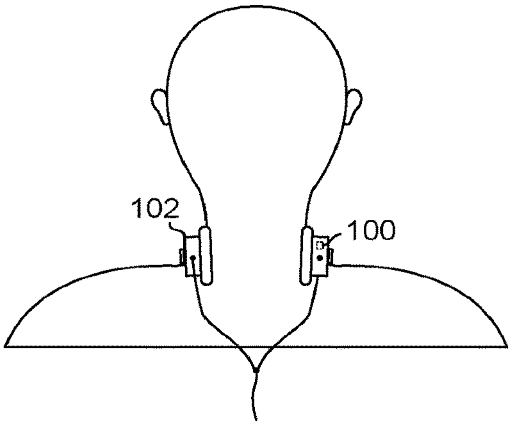
FIG. 1B shows an example of an off-ear detector integrated into a headphone, which is depicted off-ear.

The terms "being worn" and "on-ear" as used in this disclosure mean that the headphone is in or near its customary in-use position near the user's ear or eardrum. Thus, for pad- or cup-style headphones, "on-ear" means that the pad or cup is completely, substantially, or at least partially over the user's ear. An example of this is shown in FIG. 1A. For earbud-type headphones and in-ear monitors, "on-ear" means that the earbud is at least partially, substantially, or fully inserted into the user's ear. Accordingly, the term "off-ear" as used in this disclosure means that the headphone is not in or near its customary in-use position. An example of this is shown in FIG. 1B, in which the headphones are being worn around the user's neck.

The disclosed apparatus and method are suitable for headphones that are used in just one ear or in both ears. Additionally, the OED apparatus and method may be used for in-ear monitors and earbuds. Indeed, the term "headphone" as used in this disclosure includes earbuds, in-ear monitors, and pad- or cup-style headphones, including those whose pads or cups encompass the user's ear and those whose pads press against the ear.

In general, when the headphones are off-ear, there is not a good acoustic seal between the headphone body and the user's head or ear. Consequently, the acoustic pressure in the chamber between the ear or eardrum and the headphone speaker is less than the acoustic pressure that exists when the headphone is being worn. In other words, the audio response from an ANC headphone is relatively weak at low frequencies unless the headphone is being worn. Indeed, the difference in audio response between the on-ear and the off-ear conditions can be more than 20 dB at very low frequencies.

Additionally, the passive attenuation of ambient noise when the headphone is on-ear, due to the body and physical enclosure of the headphone, is significant at high frequencies, such as those above 1 kHz. But at low frequencies, such as those less than 100 Hz, the passive attenuation may be very low or even negligible. In some headphones, the body and physical enclosure actually amplifies the low ambient noise instead of attenuating it. Also, in the absence of an activated ANC feature, the ambient noise waveform at the FF and FB microphones are: (a) deeply correlated at very low frequencies, which are generally those frequencies below 100 Hz; (b) completely uncorrelated at high frequencies, which are generally those frequencies above 3 kHz; and (c) somewhere in the middle between the very low and the high frequencies. These acoustic features provide bases for determining whether or not a headphone is on-ear.

FIG. 1A shows an example of an off-ear detector 100 integrated into a headphone 102, which is depicted on-ear. The headphone 102 in FIG. 1A is depicted as being worn, or on-ear. FIG. 1B shows the off-ear detector 100 of FIG. 1A, except the headphone 102 is depicted as being off-ear. The off-ear detector 100 may be present in the left ear, the right ear, or both ears.

Figure 2:
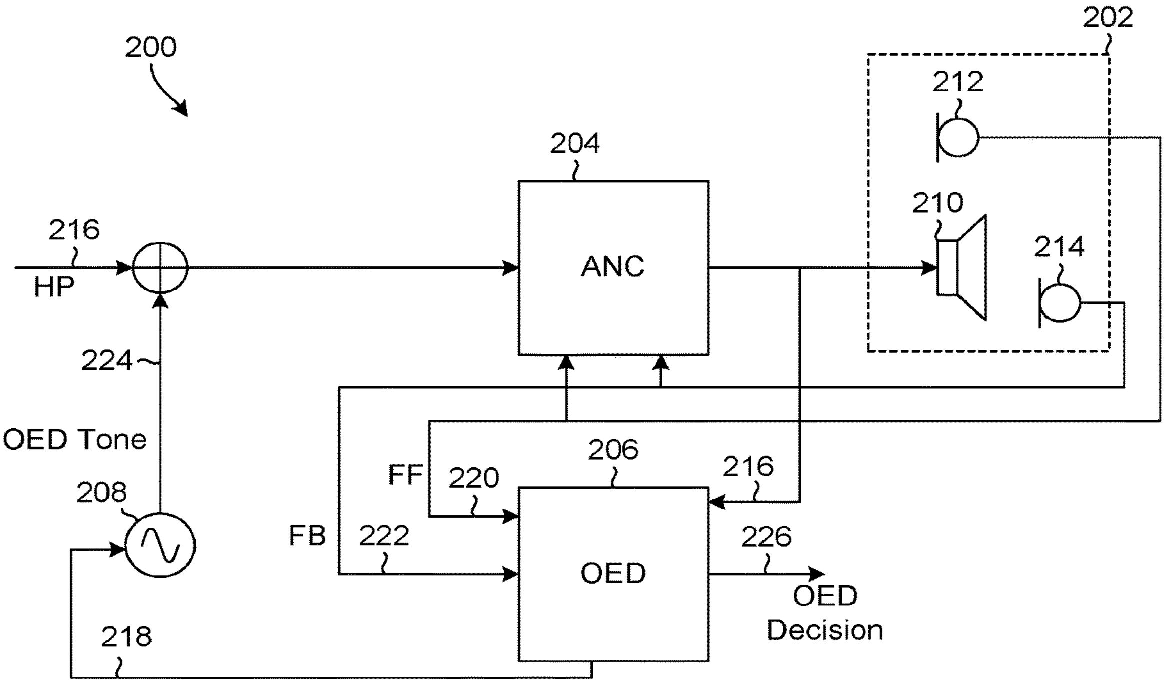
FIG. 2 illustrates an example network for off-ear detection.

FIG. 2 illustrates an example network 200 for off-ear detection, which may be an example of the off-ear detector 100 of FIGS. 1A and 1B. An example, such as shown in FIG. 2, may include a headphone 202, an ANC processor 204, an OED processor 206, and a tone source, which may be a tone generator 208. The headphone 202 may further include a speaker 210, a FF microphone 212, and a FB microphone 214.

Although likely present for the ANC features of an ANC headphone, the ANC processor 204 and the FF microphone 212 are not absolutely required in some examples of the off-ear detection network 200. The tone generator 208 is also optional, as discussed below. Examples of the off-ear detection network 200 may be implemented as one or more components integrated into the headphone 202, one or more components connected to the headphone 202, or software operating in conjunction with an existing component or components. For example, software driving the ANC processor 204 might be modified to implement examples of the off-ear detection network 200.

The ANC processor 204 receives a headphone audio signal 216 and sends an ANC-compensated audio signal 216 to the headphone 202. The FF microphone 212 generates a FF microphone signal 220, which is received by the ANC processor 204 and the OED processor 206. The FB microphone 214 likewise generates a FB microphone signal 222, which is received by the ANC processor 204 and the OED processor 206. Depending on the example, the OED processor 206 may receive the headphone audio signal 216 and/or the compensated audio signal 216. Preferably, the OED tone generator 208 generates a tone signal 224 that is injected into the headphone audio signal 216 before the headphone audio signal 216 is received by the OED processor 206 and the ANC processor 204. In some examples, though, the tone signal 224 is injected into the headphone audio signal 216 after the headphone audio signal 216 is received by the OED processor 206 and the ANC processor 204. The OED processor 206 outputs a decision signal 226 indicating whether or not the headphone 202 is being worn.

The headphone audio signal 216 is a signal characteristic of the desired audio to be played through the headphone's speaker 210 as an audio playback signal. Typically, the headphone audio signal 216 is generated by an audio source such as a media player, a computer, a radio, a mobile phone, a CD player, or a game console during audio play. For example, if a user has the headphone 202 connected to a portable media player playing a song selected by the user, then the headphone audio signal 216 is characteristic of the song being played. The audio playback signal is sometimes referred to in this disclosure as an acoustic signal.

Typically, the FF microphone 212 samples an ambient noise level and the FB microphone 214 samples the output of the speaker 210, that is, the acoustic signal, and at least a portion of the ambient noise at the speaker 210. The sampled portion includes a portion of ambient noise that is not attenuated by the body and physical enclosure of the headphone 202. In general, these microphone samples are fed back to the ANC processor 204, which produces anti-noise signals from the microphone samples and combines them with the headphone audio signal 216 to provide the ANC-compensated audio signal 216 to the headphone 202. The ANC-compensated audio signal 216, in turn, allows the speaker 210 to produce a noise-reduced audio output.

The tone source or tone generator 208, introduces or generates the tone signal 224 that is injected into the headphone audio signal 216. In some versions, the tone generator 208 generates the tone signal 224. In other versions, the tone source includes a storage location, such as flash memory, that is configured to introduce the tone signal 224 from stored tones or stored tone information. Once the tone signal 224 is injected, the headphone audio signal 216 becomes a combination of the headphone audio signal 216 before the tone signal 224, plus the tone signal 224. Thus, processing of the headphone audio signal 216 after injection of the tone signal 224 includes both. Preferably, the resulting tone has a sub-audible frequency so a user is unable to hear the tone when listening to the audio signal. The frequency of the tone should also be high enough that the speaker 210 can reliably produce, and the FB microphone 214 can reliably record, the tone, as many speakers/microphones have limited capabilities at lower frequencies. For example, the tone may have a frequency of between about 15. Hz and about 30 Hz. As another example, the tone may be a 20 Hz tone. In some implementations, a higher or lower frequency tone could be used. Regardless of the frequency, the tone signal 224 may be recorded by the FB microphone 214 and forwarded to the OED processor 206. The OED processor 206 may, in some cases, detect when the earphone has been removed by the relative strength of the tone signal 224 recorded by the FB microphone 214.

In some examples, the OED processor 206 is configured to adjust the level of the tone signal 224. Specifically, the accuracy of the OED processor's 206 ability to perform OED can be negatively impacted when noise levels become significant compared to (e.g. exceeds) the volume of the tone signal. The level of noise experienced by the network 200 is referred to herein as the noise floor. The noise floor may be affected by both the electronic noise and ambient noise. The electronic noise may occur in the speaker 210, the FF microphone 212, the FB microphone 214, signal paths between such components, and signal paths between such components and the OED processor 206. The ambient noise is the sum of environmental acoustic waves in the vicinity of the user during network 200 operation. The OED processor 206 may be configured to measure the combined noise floor, for example based on the FB microphone signal 222 and the FF microphone signal 220. The OED processor 206 may then employ a tone control signal 218 to adjust the volume of the tone signal 224 generated by the tone generator 208. The OED processor 206 may adjust the tone signal 224 to be sufficiently strong compared to (e.g. louder than) the noise floor. For example the OED processor 206 may maintain a margin between the volume of the noise floor and the volume of the tone signal 224. It should be noted that sudden rapid volume changes in the tone signal 224 may be perceived by some users despite the low frequency of the tone signal 224. Accordingly, a smoothing function may be employed by the OED processor 206 when changing the volume of the tone signal 224 to gradually change the volume (e.g. over the course of ten milliseconds to five hundred milliseconds). For example, the OED processor may adjust the volume of the tone signal 224, by employing the tone control signal 218, according to the following equation:

$$nextLevel = currentLevel \times L_0 \sqrt{\frac{NoiseFloorPowerEstimate}{CurrentSignalPower}}, \quad \text{Equation 1}$$

where currentLevel is the current tone signal 224 volume, $L_0$ is the volume margin between the noise floor and the tone signal 224, nextLevel is the adjusted tone signal 224 volume, CurrentSignalPower is the current received tone signal 224 power, and NoiseFloorPowerEstimate is an estimate of the total received noise floor including acoustic and electrical noise.

Some examples do not include the tone generator 208 or the tone signal 224. For example, if there is music playing, especially music with non-negligible bass, there may be sufficient ambient noise for the OED processor 206 to reliably determine whether the headphone 202 is on-ear or off-ear. In some examples, the tone or the tone signal 224 may not, if played by the speaker 210, result in an actual tone. Rather, the tone or the tone signal 224 may instead correspond to or result in a random noise or a pseudo-random noise, each of which may be bandlimited.

As noted above, in some versions of the off-ear detection network 200 it is not necessary to include or operate the speaker 210 and the FF microphone 212. For example, some examples include the FB microphone 214 and the tone generator 208 without the FF microphone 212. As another example, some examples include both the FB microphone 214 and the FF microphone 212. Some of those examples include the tone generator 208, and some do not. Examples not including the tone generator 208 also may or may not include the speaker 210. Additionally, note that some examples do not require a measurable headphone audio signal 216. For example, examples that include the tone signal 224 may effectively determine whether or not the headphone 202 is being worn, even in the absence of a measurable headphone audio signal 216 from an audio source. In such cases, the tone signal 224, once combined with the headphone audio signal 216, is essentially the entire headphone audio signal 216.

The OED processor 206 may perform OED in a relatively narrow frequency band, also known as a frequency bin, by injecting the tone signal 224 into the audio signal 216 and measuring the FF microphone signal 220 and FB microphone signal 222 for remnants of the tone signal 224 as modified by the noise floor and known acoustic changes between the speaker 210 and the microphones 212 and 214, which may be described as a transfer function. When audio data (e.g. music) is included in the audio signal 216 and played by the speaker 210, a the OED processor may also perform a wideband OED process to detect OED based on changes to the audio signal 216 before being recorded by the microphones 212 and 214. Various examples of such wideband and narrowband OED processes are discussed more fully below.

It should be noted that the OED processor 206 may perform OED by computing a frame OED metric, as discussed below. In one example, the OED processor determines a state change (e.g. on-ear to off-ear or vice versa) when the frame OED metric rises above and/or drops below an OED threshold. A confidence value may also be employed so that OED metrics with low confidence are rejected from consideration when performing OED. In another example, the OED processor 206 may also consider a rate of change in the OED metrics. For example, if an OED metric changes faster than a state change margin, the OED processor 206 may determine a state change even when the threshold has not been reached. In effect, the rate of change determination allows for higher effective thresholds and faster determination of state changes when the headphones are well fitted/engaged.

It should also be noted that the OED processor 206 may be implemented in various technologies, such as by a general purpose processor, an application specific integrated circuit (ASIC), a digital signal processor (DSP), a field programmable gate array (FPGA), or other processing technologies. For example, the OED processor 206 may include decimators and/or interpolators to modify the sampling rates of corresponding signals. The OED processor 206 may also include analog to digital converters (ADCs) and/or digital to analog converters (DACs) to interact with and/or process corresponding signals. The OED processor 206 may employ various programmable filters, such as bi-quad filters, band-pass filters, etc. to process the relevant signals. The OED processor 206 may also include memory modules, such as a registers, cache, etc., which allow the OED processor 206 to be programmed with relevant functionality. It should be noted that FIG. 2 includes only the components relevant to the present disclosure for purposes of clarity. Hence, a fully operational system may include additional components, as desired, which are beyond the scope of the particular functionality discussed herein.

In summary, network 200 acts as a signal processor for headphone off-ear detection. The network 200 includes an audio output to transmit an audio signal 216 toward a headphone speaker 210 in a headphone cup. The network 200 also employs a FB microphone input to receive a FB signal 222 from a FB microphone 214 in the headphone cup. The network 200 also employs OED processor 206 as an OED signal processor. As discussed in greater detail below, when operating in the frequency domain, the OED processor 206 is configured to determine an audio frequency response of the FB signal 222 over an OED frame as a received frequency response. The OED processor 206 also determines an audio frequency response of the audio signal 216 times an off-ear transfer function between the headphone speaker 210 and the FB microphone 214 as an ideal off-ear response. The OED processor 206 then generates a difference metric (e.g. frame OED metric 620) comparing the received frequency response to the ideal off-ear frequency response. Finally, the OED processor 206 employ the difference metric to detect when the headphone cup is disengaged from an ear as shown in FIG. 1B. Further, the OED processor 206 employs a FF microphone input to receive a FF signal 222 from a FF microphone 212 outside of the headphone cup. The OED processor 206 may remove a correlated frequency response between the FF signal 220 and the FB signal 222 when determining the received frequency response. The OED processor 206 may also determine an audio frequency response of the audio signal 216 times an on-ear transfer function between the headphone speaker 2120 and the FB microphone 214 as an ideal on-ear response. The OED processor 206 may then normalize the difference metric based on the ideal on-ear response. The difference metric may be determined according to equations 2-5 as discussed below. Further, the difference metric may include a plurality of frequency bins, and the OED processor 206 may weight the frequency bins. The OED processor 206 may then determine a difference metric confidence (e.g. confidence 622) as a sum of frequency bin weights. The OED processor 206 may employ the difference metric confidence when detecting the headphone cup is disengaged from the ear. In an example, the OED processor 206 may determine the headphone cup is engaged when a difference metric confidence is above a difference metric confidence threshold and the difference metric is above a difference metric threshold. In another example, the OED processor 206 may average difference metrics over an OED cycle, and determine the headphone cup is disengaged when the average difference metric is above a difference metric threshold. In another example, a plurality of difference metrics may be generated over an OED cycle, and the OED signal processor 206 may determine the headphone cup is disengaged when a change between difference metrics is greater than a difference metric change threshold.

The network 200 may also include the tone generator 208 to generate the OED tone 224 at a specified frequency bin to support generation of the difference metric when the audio signal drops below a noise floor. Further, the OED processor 206 controls the tone generator 208 to maintain a volume of the OED tone 224 above the noise floor. It should also be noted that the headphones may include two earphone, and hence a pair of FF microphones 212, speakers 210, and FB microphones 214 (e.g. left and right). As discussed in more detail below, wind noise may negatively impact the OED process. Accordingly, the OED processor 206 may select a weaker of the FF signals to determine the noise floor when wind noise is detected in a stronger of the FF signals.

Figure 3:
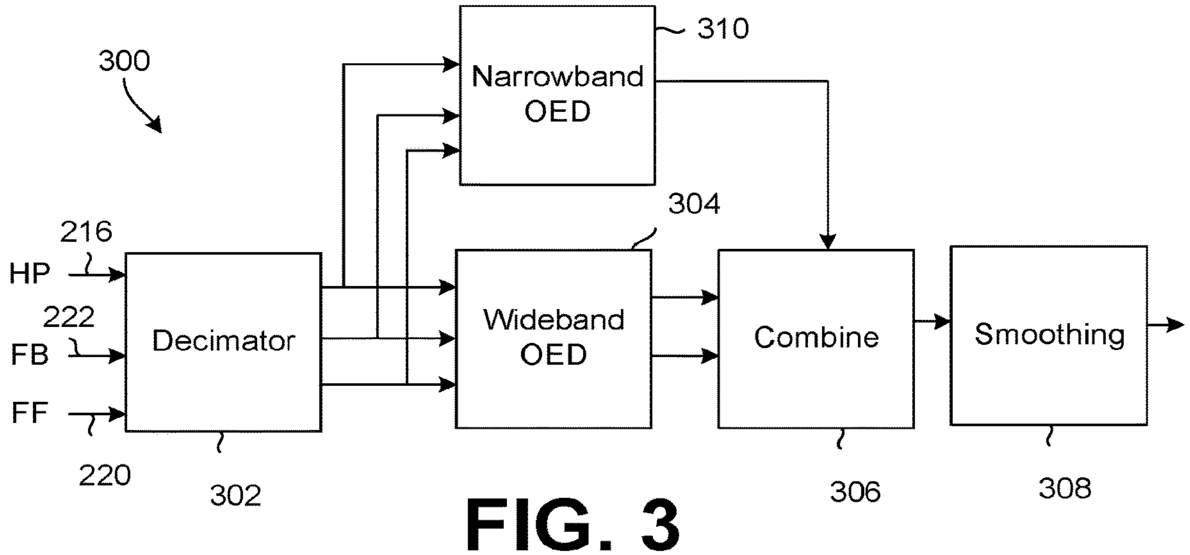
FIG. 3 illustrates an example network for combined narrowband and wideband off-ear detection.

FIG. 3 illustrates an example network 300 for combined narrowband and wideband off-ear detection. Network 300 may be implemented by circuitry in an OED processor 206. Network 300 may include a decimator 302, which may be connected to, but implemented outside of, the OED processor. The OED processor may also include a narrowband OED circuit 310, a wideband OED circuit 304, a combination circuit 306, and a smoothing circuit 308.

The decimator 302 is an optional component that reduces the sampling rate of the audio signal 216, the FB microphone signal 222, and the FF microphone signal 220, referred to collectively as the input signals. Depending on implementation, the input signals may be captured at a higher sampling rate than is supported by the OED processor. Hence, the decimator 302 reduces the sampling rate of the input signals to match the rate supported by the other circuitry.

The narrowband OED circuit 310 performs OED on acoustic changes in the frequency bin associated with the OED tone signal 224. The wideband OED circuit 304 focuses on a set of frequency bins associated with general audio output at the speaker 210, such as music. As discussed in more detail with respect to FIG. 8 below, a white noise on-ear transfer function and a white noise off-ear transfer function may be strongly correlated at some frequencies and loosely correlated at other frequencies. Accordingly, the wideband OED circuit 304 is configured to perform OED by focusing on acoustic changes, due to general audio output, in portions of the spectrum where an ideal off-ear transfer function is different from an ideal on-ear transfer function. The transfer functions are specific to the headphone design, and hence the wideband OED circuit 304 may be tuned to focus on different frequency bands for different example implementations. The primary difference is that the narrowband OED circuit 310 operates based on a sub-audible tone, and hence can operate at any time. In contrast, the wideband OED circuit 304 operates on audible frequencies, and hence only operates when the headphones are playing audio content. However, by performing OED across a wider frequency range, the wideband OED circuit 304 may increase the accuracy of the OED process over employing only the narrowband OED circuit 310. The narrowband OED circuit 310 can be implemented to operate in either time domain or frequency domain. Implementations of both domains are discussed below. The wideband OED circuit 304 is more practical to implement in the frequency domain. As such, in some examples the narrowband OED circuit 310 is implemented as a sub-component of the wideband OED circuit 304 that operates at a particular frequency bin. The narrowband OED circuit 310 and the wideband OED circuit 304 both operate on the input signals (e.g. the decimated audio signal 216, FB microphone signal 222, and FF microphone signal 220) to perform OED as discussed below.

The combination circuit 306 is any circuitry and/or process capable of combining the output of the narrowband OED circuit 310 and the wideband OED circuit 304 into usable decision data. Such outputs may be combined in a variety of ways. For example, the combination circuit 306 may select the output with the lowest OED decision value, which would bias the OED determination toward an off-ear decision. The combination circuit 306 may also select the output with the highest OED decision value, which would bias the OED determination toward an on-ear decision. In yet another approach, the combination circuit 306 employs a confidence value supplied by the wideband OED circuit 304. When the confidence is above a confidence threshold, the wideband OED circuit 304 OED determination is employed. When the confidence is below the confidence threshold, including when audio output is low volume or non-existent, the narrowband OED circuit 310 OED determination is employed. Further, in the example where the narrowband OED circuit 310 is implemented as a sub-component of the wideband OED circuit 304, a weighting process maybe employed to by and/or in lieu of the combination circuit 306.

The smoothing circuit 308 is any circuit or process that filters the OED decision values to mitigate sudden changes that could result in thrashing. For example, the smoothing circuit 308 may lower or raise individual OED metrics to that the stream of OED metrics are consistent over time. This approach removes erroneous outlier data so that a decision is reached based on multiple OED metrics. The smoothing circuit 308 may employ a forgetting filter, such as a first order infinite impulse response (IIR) low pass filter.

It should be noted that both the wideband OED circuit 304 and the narrowband OED circuit 310 are capable of mitigating negative effects associated with wind noise. Specifically, the network 300 may allow an OED signal processor, such as OED processor 206, to determine an expected phase of the FB signal 222 based on a phase of the audio signal 216. A corresponding confidence metric (e.g. confidence 622) may then be reduced when a difference in phase of a received frequency response associated with the FB signal 222 and the expected phase of the received frequency response associated with the FB signal 222 is greater than a phase margin.

Figure 4:
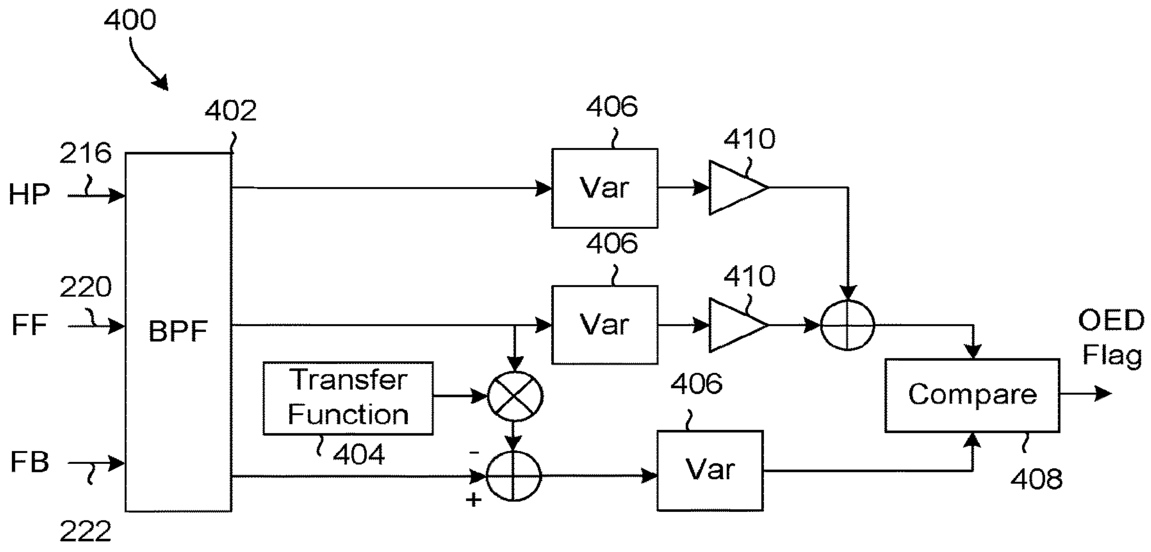
FIG. 4 illustrates an example network for narrowband off-ear detection.

FIG. 4 illustrates an example network 400 for narrowband off-ear detection. Specifically, network 400 may implement time domain OED in a narrowband OED circuit 310. In network 400, the audio signal 216, the FB microphone signal 222, and the FF microphone signal 220 are passed through a bandpass filter 402. The bandpass filter 402 is tuned to remove all signal data outside of a predetermined frequency range. For example, the network 400 may review the input signals for an OED tone 224 at a specified frequency bin, and hence the bandpass filter 402 may remove all data outside of the specified frequency bin.

The transfer function 404 is a valued stored in memory. The transfer function 404 may be determined at time of manufacture based on a calibration process. The transfer function 404 describes an amount of acoustic coupling between the FF microphone signal 220 and the FB microphone signal 222 in an ideal case when the earphone is not engaged to a user's ear. For example, the transfer function 404 may be determined in the presence of white noise at the audio signal 216. During OED, the transfer function 404 is multiplied by the FF microphone signal 220 and then subtracted from the FB microphone signal 222. This serves the subtract the expected acoustic coupling between the FF microphone signal 220 and the FB microphone signal 222 from the FB microphone signal 222. This process removes the ambient noise recorded by the FF microphone from the FB microphone signal 222.

The variance circuits 406 are provided to measure/determine the level of energy in the audio signal 216, FF microphone signal 220, and FB microphone signal 222 at the specified frequency bin. Amplifiers 410 are also employed to modify/weight the gain of the FF microphone signal 220 and the audio microphone signal 216 for accurate comparison with the FB microphone signal 222. At comparison circuit 408 the FB microphone signal 222 is compared to the combined audio signal 216 and FF microphone signal 220. When the FB microphone signal 222 is greater than the combined audio signal 216 and FF microphone signal (as weighted) by a value in excess of a predetermined narrowband OED threshold, an OED flag is set to on-ear. When the FB microphone signal 222 is not greater than the combined audio signal 216 and FF microphone signal by a value in excess of the predetermined narrowband OED threshold, the OED flag is set to off-ear. In other words, when the FB microphone signal 222 contains only attenuated audio signals 216 and noise 220, and does not contain additional energy associated with the acoustic of a user's ear as described by the narrowband OED threshold, the earphone is considered to be off-ear/disengaged by the time domain narrowband process described by network 400.

It should be noted that network 400 can also be modified to adapt to certain use cases. For example, wind noise may result in uncorrelated noise between the FB microphone signal 222 and the FF microphone signal 220. Accordingly, in the case of wind noise, removal of the transfer function 404 may result erroneously removing the wind noise from the FB microphone signal 222 as coupled data, which results in fault data. As such, the network 400 may also be modified to review the phase of the FB microphone signal 222 at the comparison circuit 408. In the event the phase of the FB microphone signal 222 is outside an expected margin, the OED flag may not be changed to avoid false results related to wind noise. It should also be noted that such modifications for wind noise are equally applicable to the wideband network (e.g. wideband OED circuit 304) discussed above.

Figure 5:
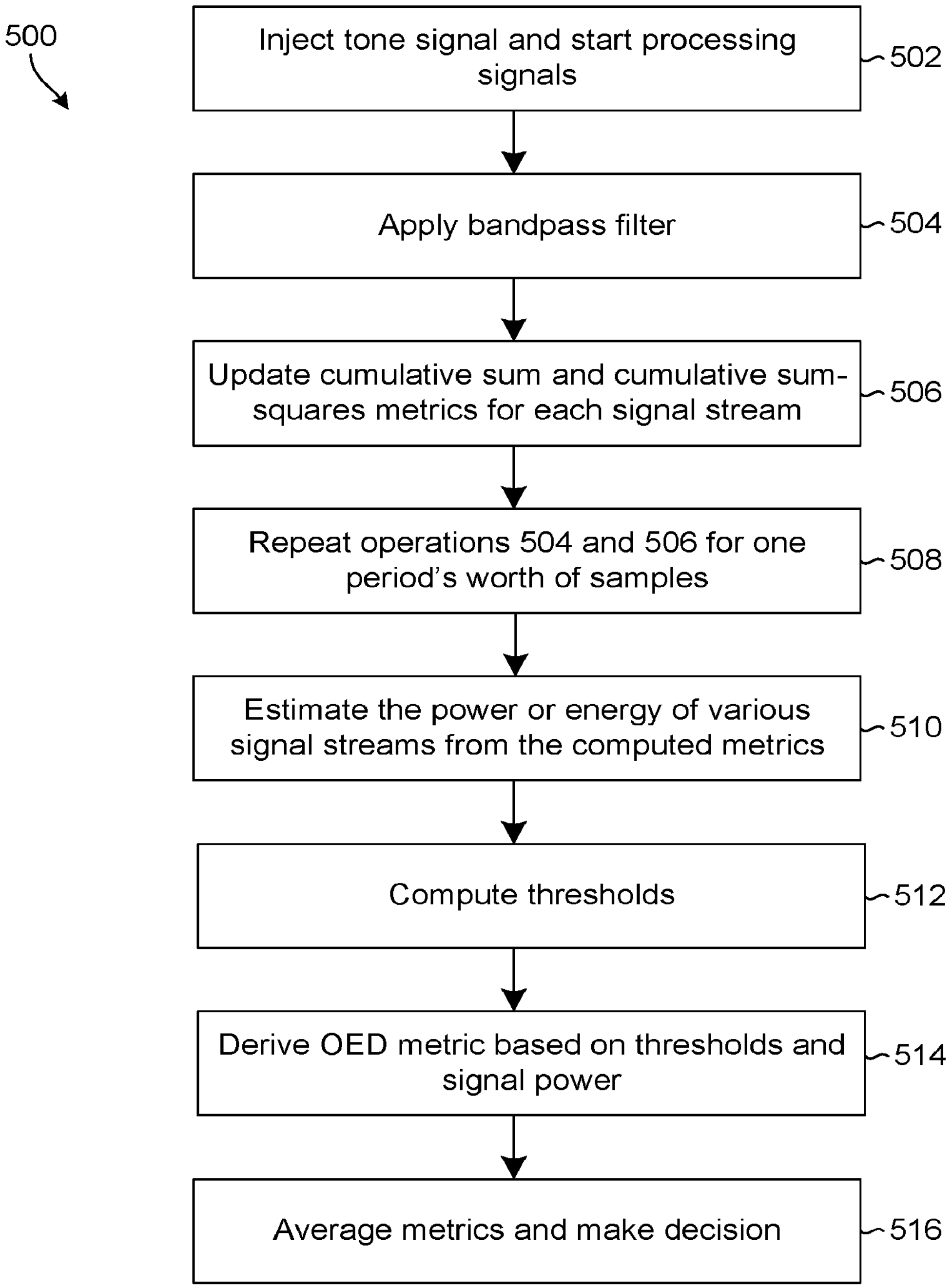
FIG. 5 is an example flow diagram illustrating a method of operations for narrowband off-ear detection (OED) signal processing.

FIG. 5 is an example flow diagram illustrating a method 500 of operations for narrowband off-ear detection (OED) signal processing, for example, by the OED processor 206, the narrowband OED circuit 310, and/or network 400. At operation 502, a tone generator injects a tone signal, and the OED processor receives the FF microphone signal and the FB microphone signal. The tone generator may raise and/or lower the tone signal to make any transient effects inaudible to the listener while maintaining a volume above a noise floor. The headphone audio signal, the FF microphone signal, and the FB microphone signal may be available in bursts, with each burst containing one or more samples of the signals. As noted above, the tone signal and the FF microphone signal are optional, so some examples of the method 500 may not include injecting the tone signal or receiving the FF microphone signal 220.

The time domain ambient noise waveform correlation between the FF microphone signal and FB microphone signal is better for narrowband signals than wideband signals. This is an effect of non-linear phase response of the headphone enclosure. Thus, at operation 504, a bandpass filter may be applied to the headphone audio signal, the FF microphone signal, and the FB microphone signal. The bandpass filter may include a center frequency of less than about 100 Hz. For example, the bandpass filter may be a 20 Hz bandpass filter. Thus, the lower cutoff frequency for the bandpass filter could be around 15 Hz, and the upper cutoff frequency for the bandpass filter could be around 30 Hz, resulting in a center frequency of about 23 Hz. The bandpass filter may be a digital bandpass filter and may be part of an OED processor. For example, the digital bandpass filter could be four biquadratic filters: two each for the low-pass and the high-pass sections. In some examples, a low-pass filter may be used instead of a bandpass filter. For example, the low-pass filter may attenuate frequencies greater than about 100 Hz or greater than about 30 Hz. Regardless of which filter is used, the filter state is maintained for each signal stream from one burst to the next.

At operation 506, the OED processor updates, for each sample, data related to the sampled data. For example, the data may include cumulative sum and cumulative sum-squares metrics for each of the headphone audio signal, the FF microphone signal, and the FB microphone signal 2. The sum-squares are the sums of the squares.

At operation 508, operation 504 and operation 506 are repeated until the OED processor processes a preset duration of samples. For example, the preset duration could be one second's worth of samples. Another duration could also be used.

At operation 510, the OED processor determines a characteristic, such as the power or energy of one or more of the headphone audio signal, the FF microphone signal, and the FB microphone signal, from the metrics computed in the previous operations.

At operation 512, the OED processor computes relevant thresholds. The thresholds may be computed as a function of the audio signal power and the FF microphone signal power. For example, the volume of music in the audio signal and/or the ambient noise recorded in the FF microphone signal may vary significantly over time. Accordingly, the corresponding thresholds and/or margins may be updated based on pre-defined OED parameters, as desired, to handle such scenarios. At operation 514, an OED metric is derived based on the threshold(s) determined in operation 512 and the signal power determined at operation 514.

At operation 516, the OED processor assesses whether the headphone is on-ear or off-ear. For example, the OED processor may compare the power or energy of one or more of the headphone audio signal, the FF microphone signal, and the FB microphone signal to one or more thresholds or parameters. The thresholds or parameters may correspond to one or more of the headphone audio signal, the FF microphone signal, or the FB microphone signal, or the power or energy of those signals, under one or more known conditions. The known conditions may include, for example, when the headphone is already known to be on-ear or off-ear or when the OED tone is playing or not playing. Once the signal values, energy values, and power values are known for the known conditions, those known values may be compared to determined values from an unknown condition to assess whether or not the headphone is off-ear.

The operation 516 may also include the OED processor averaging multiple metrics over time and/or outputting a decision signal, such as OED decision signal 226. The OED decision signal 226 may be based at least in part on whether the headphone is assessed to be off-ear or on-ear. The operation 516 may also include forwarding the outputting the decision signal to a combination circuit 306 for comparison with wideband OED circuit 304 decisions in some examples.

Figure 6:
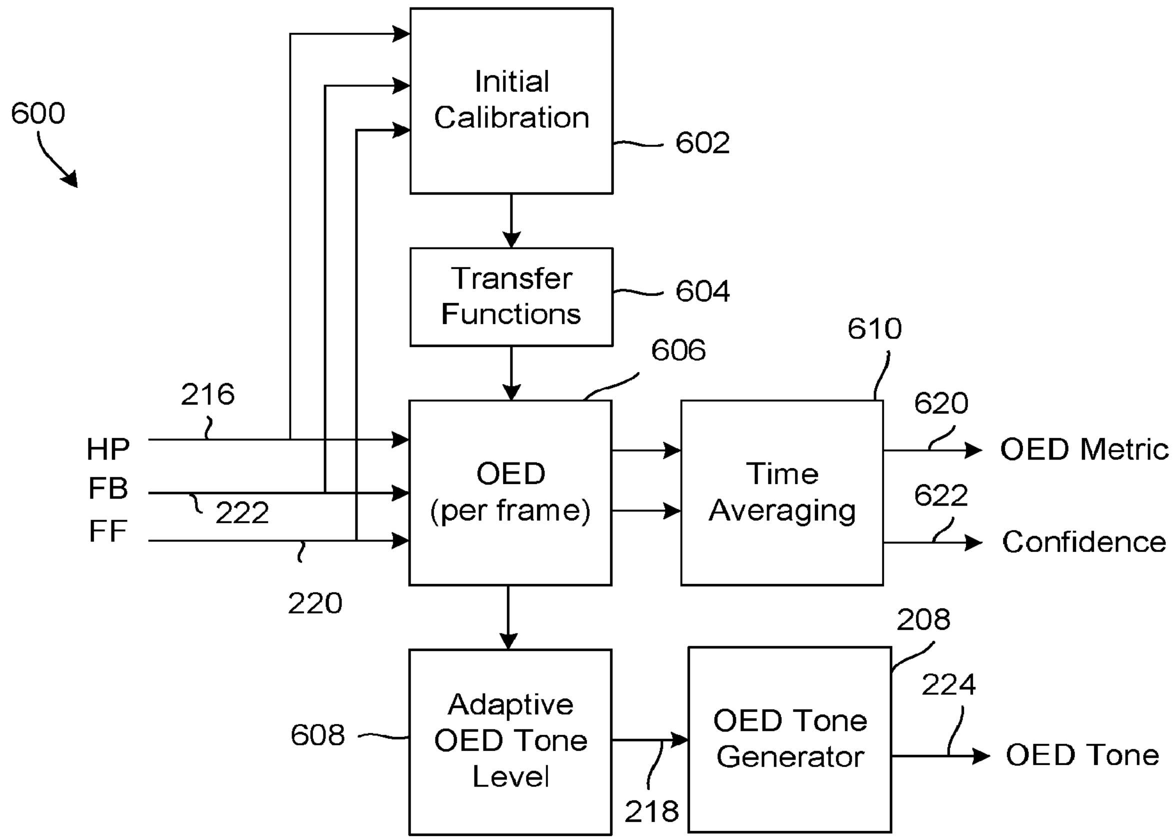
FIG. 6 illustrates an example network for wideband off-ear detection.

FIG. 6 illustrates an example network 600 for wideband off-ear detection. The network 600 may be employed to implement a wideband OED circuit 304 in an OED processor 206. Network 600 is configured to operate in the frequency domain. Further, network 600 performs both narrowband OED and wideband OED, and hence may also implement narrowband OED circuit 310.

The network 600 includes an initial calibration 602 circuit, which is a circuit or process that performs a calibration at the time of manufacture. Activating the initial calibration 602 may include testing the headphones under various conditions, for example on-ear and off-ear conditions in the presence of a white noise audio signal. The initial calibration 602 determines and stores various transfer functions 604 under known conditions. For example, the transfer functions 604 may include a transfer function between the audio signal 216 and the FB microphone signal 222 when off-ear ($T_{HP}^{Off}$), a transfer function between the audio signal 216 and the FB microphone signal 222 when on-ear ($T_{HP}^{On}$), a transfer function between the FF microphone signal 220 and the FB microphone signal 222 when off-ear ($T_{FF}^{Off}$), and a transfer function between the FF microphone signal 220 and the FB microphone signal 222 when on-ear ($T_{FF}^{On}$). The transfer functions 604 are then used at runtime to perform frequency domain OED by an OED circuit 606.

The OED circuit 606 is a circuit that performs the OED process in the frequency domain. Specifically, the OED circuit 606 produces an OED metric 620. The OED metric 620 is a normalized weighted value that describes the difference between a measured acoustic response and an ideal off-ear acoustic response over a plurality of frequency bins. The measured acoustic response is determined based on the audio signal 216, the FB microphone signal 222, and the FF microphone signal 220, as discussed in more detail below. The OED metric 620 is normalized by a value that describes the difference between the measured acoustic response and an ideal on-ear acoustic response over the frequency bins. The weights applied to the OED metric 620 can then be aggregated to generate a confidence value 622. The confidence value 622 can then be employed to determine to what extent the OED metric 620 should be relied upon by the OED processor. The frequency domain OED process is discussed in greater detail with respect to FIG. 9 below.

A time averaging circuit 610 may then be employed to average multiple OED metrics 620 over a specified period, for example based on a forgetting filter, such as a first order infinite impulse response (IIR) low pass filter. The average may be weighted according to the corresponding confidence values 622. In other words, the time averaging circuit 610 is designed to consider the difference in confidence 622 in various frame OED metrics 620 over time. The frame OED metrics 620 associated with greater confidence 622 are emphasized/trusted in the average while frame OED metrics 620 associated with lower confidence 622 are de-emphasized and/or forgotten. The time averaging circuit 610 may be employed to implement a smoothing filter 308 to mitigate thrashing in the OED decision process.

The network 600 may also include an adaptive OED tone level control circuit 608, which is any circuit or process capable of generating a tone control signal 218 to control a tone generator 208 when generating a tone signal 224. The adaptive OED tone level control circuit 608 determines an ambient noise floor based on the FF microphone signal 220 and generates the tone control signal 218 to adjust tone signal 224 accordingly. The adaptive OED tone level control circuit 608 may determine an appropriate tone signal 224 volume to maintain the tone signal 224 near to and/or or above the volume of the noise floor, for example according to equation 1 above. The adaptive OED tone level control circuit 608 may also apply a smoothing function, as discussed above, to mitigate sudden changes in tone signal 224 volume that might be perceived by some users.

Figure 7:
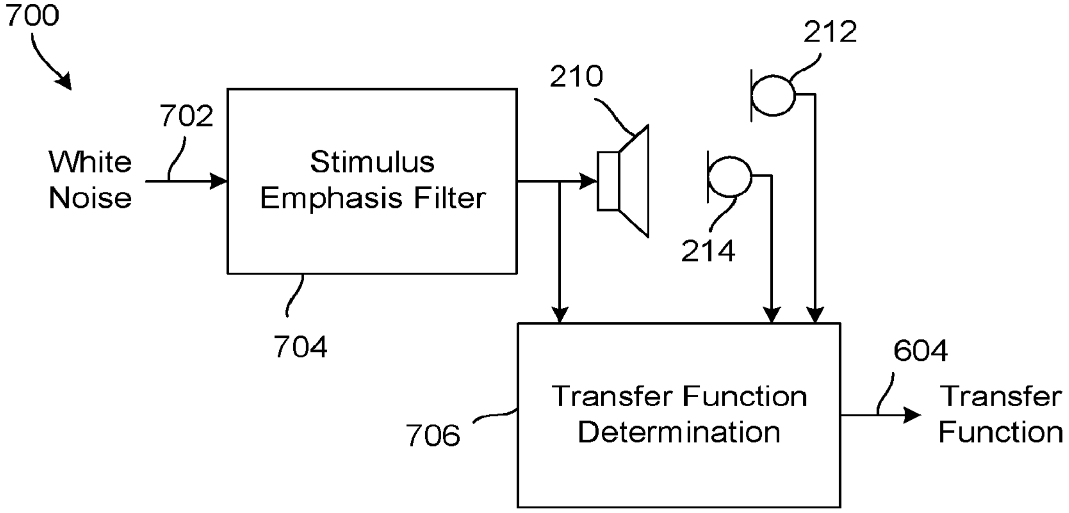
FIG. 7 illustrates an example network for transfer function calibration.

FIG. 7 illustrates an example network 700 for transfer function 604 calibration. The network 700 may be employed at the time of manufacture, and the determined transfer functions 604 may be stored in memory for use at run time in network 600. A sample of white noise 702 may be applied to a stimulus emphasis filter 704. White noise 702 is a random/pseudorandom signal that contains roughly equal energy/intensity (e.g. constant power spectral density) across a relevant frequency band. For example, the white noise 702 may contain approximately equal energy across an audible and sub-audible frequency range employed by the headphones. Due to physical constraints related to design of the headphones, the microphones 212 and 214 may receive different levels of energy at different frequency. Accordingly, the stimulus emphasis filter 704 is one or more filters that modify the white noise 702 when played from the speaker 210 so that energy received by the relevant microphones 212 and 214 is approximately constant at each frequency bin. The network 700 then employs a transfer function determination circuit 706 to determine the transfer functions 604. Specifically, the transfer function determination circuit 706 determines the change in signal strength between the speaker 210 and the FF microphone 212 and the change in signal strength between the speaker 210 and the FB microphone 214 in both an ideal off-ear configuration and an acoustically sealed ideal on-ear configuration. In other words, the transfer function determination circuit 706 determines and saves $T_{HP}^{Off}$, $T_{HP}^{On}$, $T_{FF}^{Off}$, and $T_{FF}^{On}$ as the transfer function 604 for use in network 600 at run time.

Figure 8:
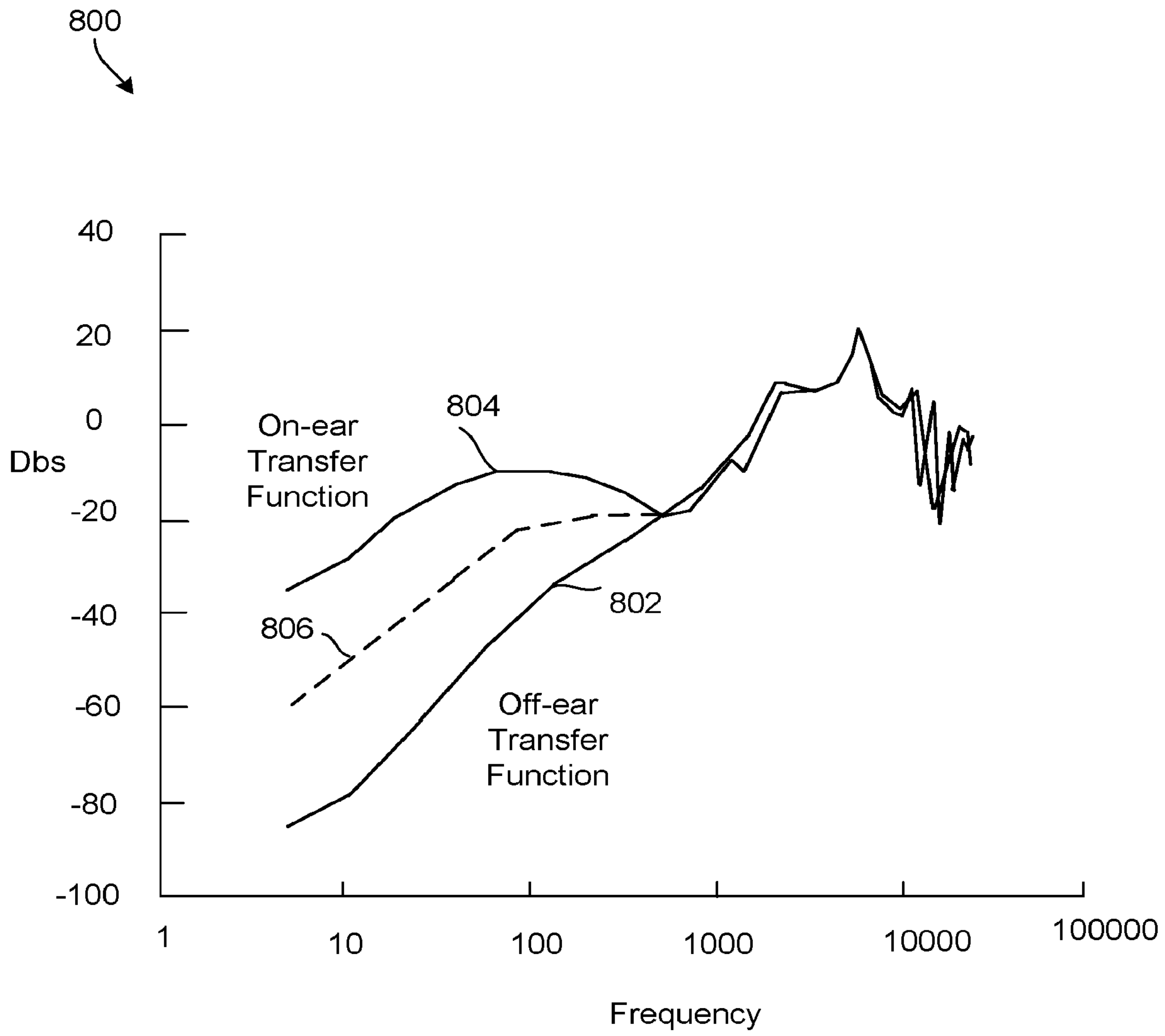
FIG. 8 is a graph of example transfer functions.

FIG. 8 is a graph 800 of example transfer functions, for example between a speaker 210 and a FB microphone 214 in a headphone. Graph 800 illustrates an example on-ear transfer function 804 and off-ear transfer function 802. The transfer functions 802 and 804 are depicted in terms of magnitude in decibels (dBs) versus frequency in hertz (Hz) on an exponential scale. In this example, the transfer functions 802 and 804 are highly correlated above about 500 Hz. However, the transfer functions 802 and 804 are different between about 5 Hz and about 500 Hz. As such, the wideband OED circuit, such as wideband OED circuit 304 may operate on a band from about 5 Hz to about 500 Hz for headphones with transfer functions depicted by graph 800.

For purposes of discussion, an OED line 806 has been depicted half way between the transfer functions 802 and 804. Graphically, when a measured signal is graphed between the transfer functions 802 and 804, OED is determined relative to the OED line 806. Each frequency bin can be compared to the OED line 806. When a measured signal has a magnitude below the OED line 806 for a particular frequency bin, that frequency is considered off-ear. When a measured signal has a magnitude above the OED line 806 for a particular frequency bin, that frequency is considered on-ear. The distance above or below the OED line 806 informs the confidence in such a decision. Hence, the distance between the measured signal at a frequency bin and the OED line 806 is employed to generate a weight for that frequency bin. As such, decisions near the OED line 806 are given little weight and decisions near the on-ear transfer function 804 or off-ear transfer function 802 are given significant weight. As the distance between the transfer functions 802 and 804 vary at different frequencies, the OED metric is normalized, for example so small fluctuations where the transfer function difference is small are given as much consideration as larger fluctuations at frequencies where the transfer function difference is larger. An example equation for determining the weighted and normalized OED metric is discussed below.

Figure 9:
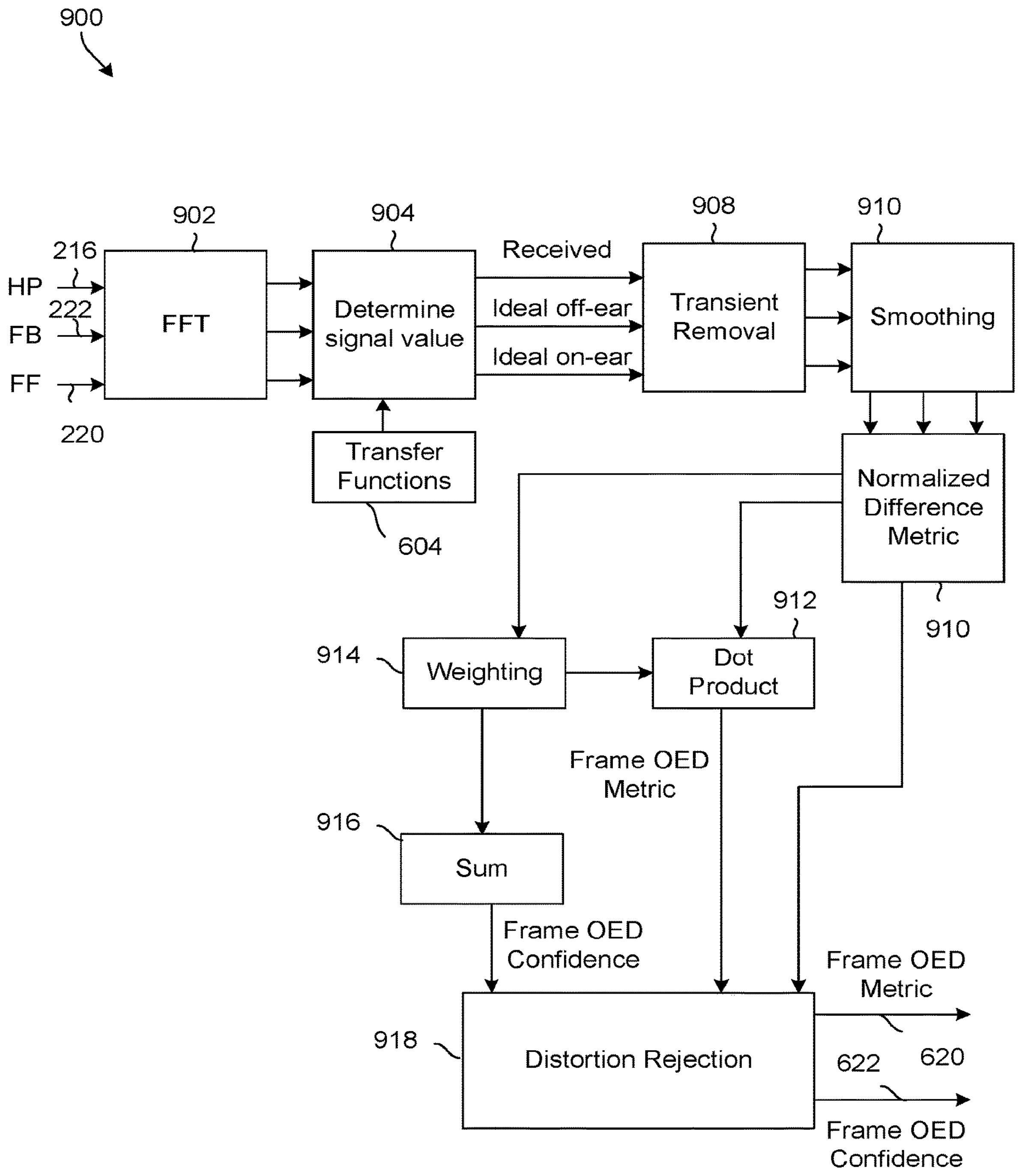
FIG. 9 illustrates an example network for wideband OED metric determination.

FIG. 9 illustrates an example network 900 for wideband OED metric determination. For example, network 900 may be employed to implement OED circuit 206, wideband OED circuit 304, narrowband OED circuit 310, combination circuit 306, smoothing circuit 308, OED circuit 606, and/or combinations thereof. The network 900 includes a Fast Fourier Transform (FFT) circuit 902. The FFT circuit 902 is any circuit or process capable of converting input signal(s) into the frequency domain for further computation. The FFT circuit 902 converts the audio signal 216, the FB microphone signal 222, and the FF microphone signal 224 into the frequency domain. For example, the FFT circuit 902 may apply a five hundred twelve point FFT to the input signals with windowing. The FFT circuit 902 forwards the converted input signals to a determine audio value circuit 904.

The determine audio value circuit 904 receives the transfer functions 604 and the input signals and determines the uncorrelated frequency of the audio signal 216 received in the FB microphone signal 222. Such value may be determined according to equation 2:

$$\text{Received}=FB-FF(T_{FF}^{Off}), \quad \text{Equation 2}$$

where received is the uncorrelated frequency response of the audio signal at the FB microphone, FB is the frequency response of the FB microphone, FF is the frequency response of the FF microphone, and $T_{FF}^{Off}$ is the transfer function between the audio signal and the FF microphone signal 222 when off-ear. In other words, received includes the audio signal as received at the FB microphone without noise components recorded by the FF microphone. The determine audio value circuit 904 also determines the ideal off-ear and ideal on-ear frequency responses that would be expected at the FB microphone based on the audio signal, which can be determined according to equations 3-4, respectively:

$$\text{Ideal\_off\_ear}=HP(T_{HP}^{Off}),$$

$$\text{Ideal\_on\_ear}=HP(T_{HP}^{On}), \quad \text{Equations 3-4}$$

where Ideal_off_ear is an ideal off-ear frequency response at the FB microphone based on the audio signal, HP is the frequency response of the audio signal, $T_{HP}^{Off}$ is the ideal transfer function between the audio speaker and the FB microphone when off-ear, Ideal_on_ear is an ideal on-ear frequency response at the FB microphone based on the audio signal, and $T_{HP}^{On}$ is the ideal correlation between the audio speaker and the FB microphone when on-ear.

The determine audio value circuit 904 may forward these values to an optional transient removal circuit 908 (or directly to a smoothing circuit 910 in some examples). The transient removal circuit 908 is any circuit or process capable of removing transient timing mismatches at the leading and trailing edges of the frequency response window. The transient removal circuit 908 may remove such transients by windowing in some examples. In other examples, the transient removal circuit 908 may remove transients by computing an inverse FFT (IFFT), applying the IFFT to the values to convert them to the time domain, zero a portion of the values equal to an expected transient length, and applying another FFT to return the values to the frequency domain. The determine audio value circuit 904 then forwards the values to a smoothing circuit 910, which may smooth the values with a forgetting filter as discussed above with respect to smoothing circuit 306.

A normalized difference metric circuit 910 then computes a frame OED metric 620. Specifically, the normalized difference metric circuit 910 compares the estimated off-ear frequency response and actual received response to quantify how different they are. The results is then normalized based on the estimated on-ear response. In other words, the frame OED metric 620 includes a measure of deviation of the received signal from the ideal off-ear signal, which may also be normalized by the deviation of the ideal on-ear signal from the ideal off-ear signal at the frequency bin. For example, the frame OED metric 620 may be determined according to equation 5 below:

$$\text{normalized\_difference\_metric} = \frac{\log\frac{|\text{Recieved}|}{|\text{Idea\_off\_ear}|}}{\log\frac{|\text{Ideal\_on\_ear}|}{|\text{Ideal\_off\_ear}|}}, \quad \text{Equation 5}$$

where normalized_difference_metric is the frame OED metric 620 and the other values are as discussed in equations 3-4.

The frame OED metric 620 is then forwarded to a weighting circuit 914. The weighting circuit 914 is any circuit or process capable of weighting frequency bins in the frame OED metric 620. The weighting circuit 914 may weight the frequency bins in the frame OED metric 620 based on multiple rules selected to emphasize accurate values and deemphasize suspect values. The following are example rules that may be used to weight a frame OED metric 620. First, selected frequency bins may be weighted to zero in order to remove extraneous information. For example, the frequency bin for the tone and a relevant audio band of frequency bins (e.g. 20 Hz and 100 Hz-500 Hz) may be given a weight of one and other bins weighted to zero. Second, bins with a signal below the noise floor may also be weighted to zero to mitigate the influence of noise on the determination. Third, frequency bins may be compared to each other, such that bins containing power that is negligible compared to the most powerful bin (e.g. below a power difference threshold) may be weighted down. This de-emphasizes the frequency bins that are least likely to have useful information. Fourth, bins with the highest difference between the ideal on-ear/off-ear values and the measured value are weighted up. This emphasizes the frequency bins that are most likely to be determinative. Fifth, bins with an insignificant difference (e.g. below a power difference threshold) between the ideal on-ear/off-ear values and the measured value are weighted down. This de-emphasizes frequency bins near the OED line 806 as discussed above, because such bins are more likely to give false results due to random measurement variance. Six, bins that act as local maxima (e.g. greater than both neighbors) are weighted up to one, as such bins are most likely to be determinative. A sum of the weights may then be determined by a sum circuit 916 to determine a Frame OED confidence 622 value. In other words, a significant number of high weights indicates the Frame OED metric 620 is likely accurate, while no high weights indicates the Frame OED metric 620 is likely in-accurate (e.g. noisy sample, bins near the OED line 806 that could indicate either on or off ear, etc.) A dot product circuit 912 applies a dot product of the weights to the Frame OED metric 620 to apply the weights to the Frame OED metric 620. The Frame OED metric 620 may then act as a determination based on a plurality of frequency bin decisions.

The Frame OED metric 620 and the Frame OED confidence 622 value may also be forwarded through a distortion rejection circuit 918. The distortion rejection circuit 918 is a circuit or process capable of determining the presence of significant distortion and reducing the Frame OED confidence 622 value to zero in the event distortion is greater than a distortion threshold. Specifically, the design of network 900 presumes that the audio signal 216 flows to the FB microphone in a relatively linear fashion. However, in some cases, the audio signal 216 saturates the FB microphone causing clipping. This may occur, for example, when a user listens to high volume music and removes the headphones. In such a case, the signal received at the FB microphone is very different from the ideal off ear transfer function due to the distortion, which may result in an on-ear determination. Accordingly, the distortion rejection circuit 918 computes a distortion metric whenever the Frame OED metric 620 indicates an on-ear determination. The distortion metric may be defined as the variance of the detrended normalized difference metric over the bins with non-zero weight (e.g. excluding the OED tone bin). Another interpretation for distortion metric is the minimum mean square error for a straight-line fit. The distortion metric may only be applied when more than one bin has a non-zero weight. Distortion rejection is discussed more below. In summary, the distortion rejection circuit 918 generates a distortion metric when the determination is on-ear, and weights the Frame OED confidence 622 (causing the system to ignore the Frame OED metric 620) when distortion is above a threshold.

Figure 10:
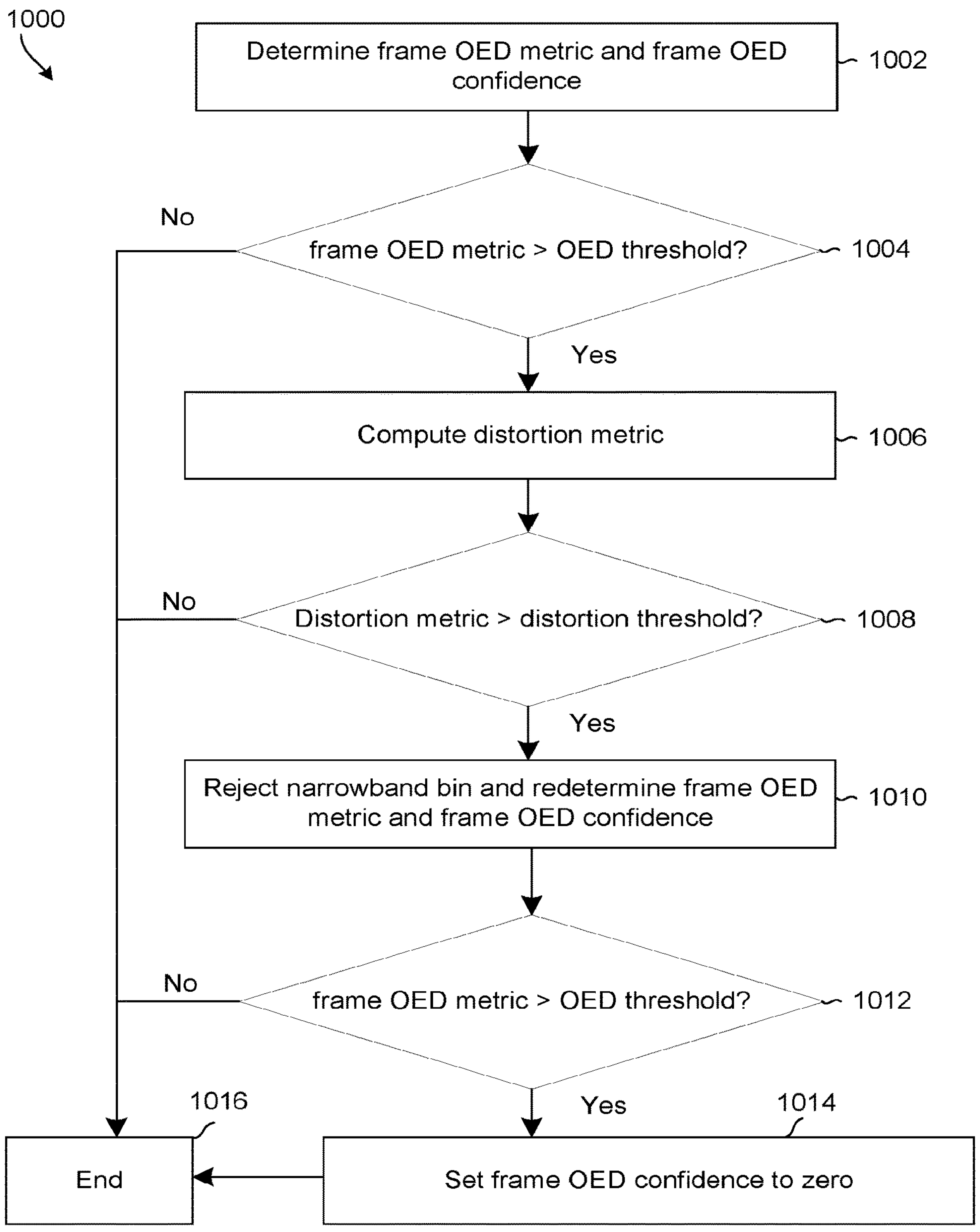
FIG. 10 is an example flow diagram illustrating a method for distortion detection.

FIG. 10 is an example flow diagram illustrating a method 1000 for distortion detection, for example by a distortion rejection circuit 918 operating in an OED circuit 606 in a wideband OED circuit 304 of an OED processor 206, and/or combinations thereof. At block 1002, a frame OED metric 620 and a frame OED confidence 622 are computed, for example according to the processes described with respect to network 900. At block 1004, the frame OED metric is compared to an OED threshold to determine if the headphones are considered on ear. As noted above, the distortion detection method 1000 focuses on the case where a headphone is improperly considered on-ear. Accordingly, when the frame OED metric is not greater than the OED threshold, the determination is the headphones are off-ear and distortion is not a concern. Hence, when the frame OED metric is not greater than the OED threshold, the method 1000 proceeds to block 1016 and ends by moving to a next OED frame. When the frame OED metric is greater than the OED threshold, the determination is on-ear and distortion may be an issue. Hence, the method proceeds to block 1006 when the frame OED metric is greater than the OED threshold.

At block 1006, a distortion metric is computed. Computing a distortion metric involves computing a best fit line in between the frequency bin points in the frame OED metric. The distortion metric is the mean squared error for an approximation of the line slope. In other words, block 1006 computes a linear fit to detect distortion in frequency domain sample. At block 1008, the distortion metric is compared to a distortion threshold. The distortion threshold is a mean square error value, and hence if the mean square error of the distortion metric is higher than the acceptable mean square error specified by the distortion threshold, distortion may be a concern. As an example, the distortion threshold may be set at about two percent. As such, when the distortion metric is not greater than the distortion threshold, the method 1000 proceeds to block 1016 and ends. When the distortion metric is greater than the distortion threshold, the method 1000 proceeds to block 1010.

Effects of distortion may be more extreme at low frequency bins because, generally less signal energy is received by the FB microphone at lower frequencies. As such, small amounts of distortion may negatively impact the narrowband frequency bin while not significantly impacting the higher frequencies. Accordingly, at block 1010 the narrowband frequency bin may be rejected and the frame OED metric and frame OED confidence recomputed without the narrowband frequency bin. Then at block 1012 the recomputed frame OED metric is compared to the OED threshold. If the frame OED metric does not exceed the OED threshold, the headphones are considered off-ear and distortion is no longer an issue. As such, if the frame OED metric without the narrowband frequency bin does not exceed the OED threshold, the determination of off-ear is maintained and the method 1000 proceeds to block 1016 and ends. If the frame OED metric without the narrowband frequency bin still exceeds the OED threshold (e.g. is still considered on-ear) then the distortion may be causing an incorrect OED determination. As such, the method proceeds to block 1014. At block 1014, the OED confidence is set to zero, which causes the frame OED metric to be ignored. The method 1000 then proceeds to block 1016 and ends to move to the next frame of OED determination.

In summary, the method 1000 may allow an OED signal processor, such as OED processor 206 to determine a distortion metric based on a variance of a difference metric (e.g. frame metric) over a plurality of frequency bins, and ignore the difference metric when the distortion metric is greater than a distortion threshold.

Figure 11:
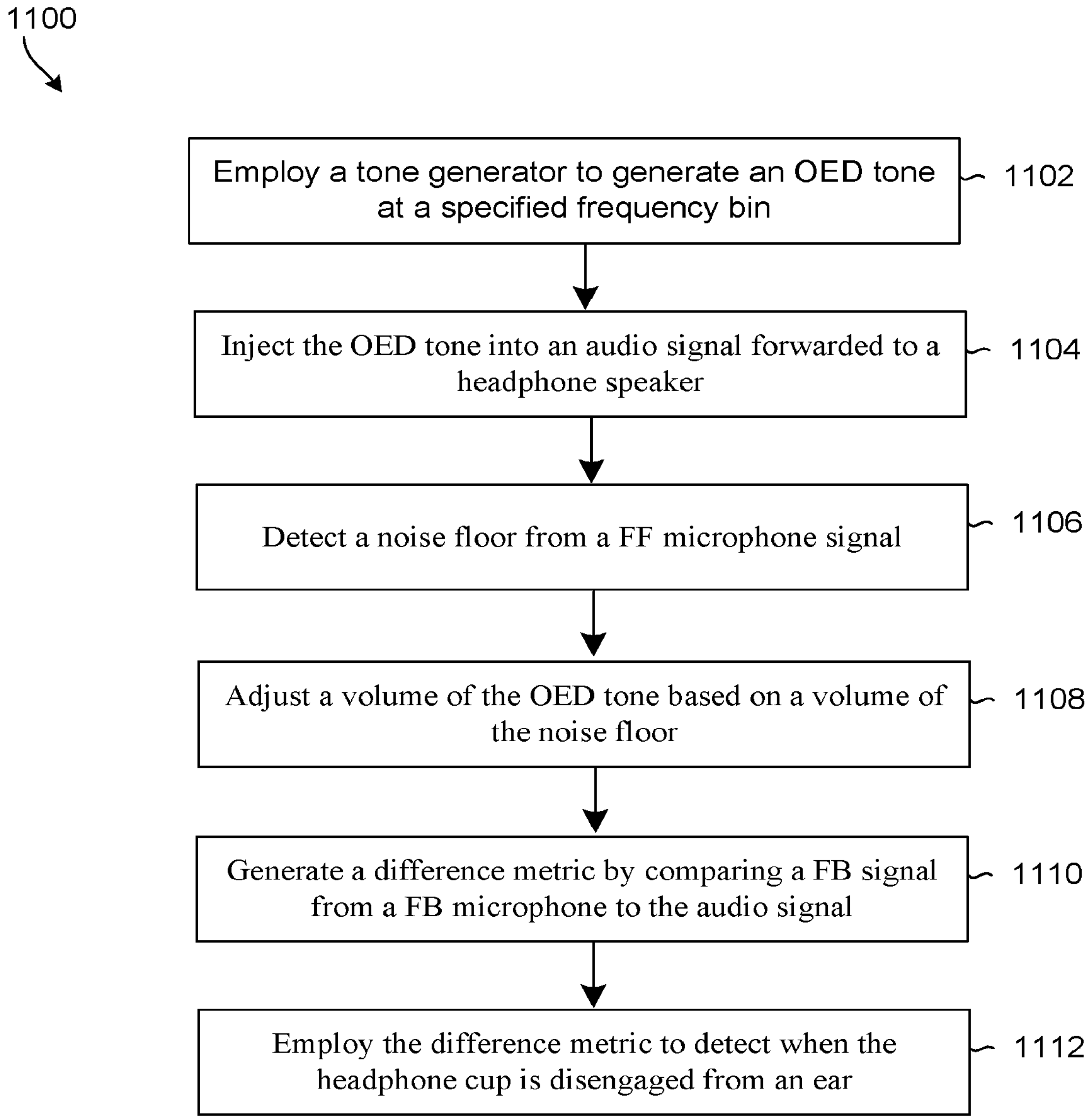
FIG. 11 is an example flow diagram illustrating a method of OED.

FIG. 11 is an example flow diagram illustrating a method 1100 of OED, for example by employing an OED processor 206, wideband OED circuit 304, narrowband OED circuit 310, network 600, network 900, any other processing circuitry discussed herein, and/or any combination thereof. At block 1102, a tone generator is employed to generate an OED tone at a specified frequency bin, such as a sub-audible frequency. At block 1104, the OED tone is injected into an audio signal forwarded to a headphone speaker. At block 1106, a noise floor is detected from a FF microphone signal. At block 1108, a volume of the OED tone is adjusted based on a volume of the noise floor. For example, a tone margin may be maintained between the volume of the OED tone and the volume of the noise floor. Further, a magnitude of volume adjustments to the OED tone over time are may be maintained below an OED change threshold, for example by employing equation 1 above.

At block 1110, a difference metric is by comparing a FB signal from a FB microphone to the audio signal. The difference metric may be determined according to as any OED metric and/or confidence determination process discussed herein. For example, the difference metric may be generated by determining an audio frequency response of the FB signal over an OED frame as a received frequency response, determining an audio frequency response of the audio signal times an off-ear transfer function between the headphone speaker and the FB microphone as an ideal off-ear response, and generating a difference metric comparing the received frequency response to the ideal off-ear frequency response. The difference metric may be determined over a plurality of frequency bins, including the specified frequency bin (e.g. sub-audible frequency bin). Further, the difference metric may be determined by weighting the frequency bins, determining a difference metric confidence as a sum of frequency bin weights; and employing the difference metric confidence when detecting the headphone cup is disengaged from the ear.

Finally, at block 1112, the difference metric is employed to detect when the headphone cup is engaged/disengaged from an ear. For example, a state change may be determined when the difference metric rises above and/or drops below an OED threshold. A confidence value may also be employed so that difference metrics with low confidence are rejected from consideration when performing OED. In another example, the as state change can be detected when a difference metric changes faster than a state change margin. As another example, a state change may be determined when a weighted average of difference metrics rises above/drops below a threshold, where weighting is based on confidence and a forgetting filter.

Examples of the disclosure may operate on a particularly created hardware, on firmware, digital signal processors, or on a specially programmed general purpose computer including a processor operating according to programmed instructions. The terms “controller” or “processor” as used herein are intended to include microprocessors, microcomputers, Application Specific Integrated Circuits (ASICs), and dedicated hardware controllers. One or more aspects of the disclosure may be embodied in computer-usable data and computer-executable instructions (e.g. computer program products), such as in one or more program modules, executed by one or more processors (including monitoring modules), or other devices. Generally, program modules include routines, programs, objects, components, data structures, etc. that perform particular tasks or implement particular abstract data types when executed by a processor in a computer or other device. The computer executable instructions may be stored on a non-transitory computer readable medium such as Random Access Memory (RAM), Read Only Memory (ROM), cache, Electrically Erasable Programmable Read-Only Memory (EEPROM), flash memory or other memory technology, and any other volatile or nonvolatile, removable or non-removable media implemented in any technology. Computer readable media excludes signals per se and transitory forms of signal transmission. In addition, the functionality may be embodied in whole or in part in firmware or hardware equivalents such as integrated circuits, field programmable gate arrays (FPGA), and the like. Particular data structures may be used to more effectively implement one or more aspects of the disclosure, and such data structures are contemplated within the scope of computer executable instructions and computer-usable data described herein.

Aspects of the present disclosure operate with various modifications and in alternative forms. Specific aspects have been shown by way of example in the drawings and are described in detail herein below. However, it should be noted that the examples disclosed herein are presented for the purposes of clarity of discussion and are not intended to limit the scope of the general concepts disclosed to the specific examples described herein unless expressly limited. As such, the present disclosure is intended to cover all modifications, equivalents, and alternatives of the described aspects in light of the attached drawings and claims.

References in the specification to embodiment, aspect, example, etc., indicate that the described item may include a particular feature, structure, or characteristic. However, every disclosed aspect may or may not necessarily include that particular feature, structure, or characteristic. Moreover, such phrases are not necessarily referring to the same aspect unless specifically noted. Further, when a particular feature, structure, or characteristic is described in connection with a particular aspect, such feature, structure, or characteristic can be employed in connection with another disclosed aspect whether or not such feature is explicitly described in conjunction with such other disclosed aspect.

EXAMPLES

Illustrative examples of the technologies disclosed herein are provided below. An embodiment of the technologies may include any one or more, and any combination of, the examples described below.

Example 1 includes a signal processor for headphone off-ear detection, the signal processor comprising: an audio output to transmit an audio signal toward a headphone speaker in a headphone cup; a feedback (FB) microphone input to receive a FB signal from a FB microphone in the headphone cup; and an off-ear detection (OED) signal processor configured to: determine an audio frequency response of the FB signal over an OED frame as a received frequency response, determine an audio frequency response of the audio signal times an off-ear transfer function between the headphone speaker and the FB microphone as an ideal off-ear response, generate a difference metric comparing the received frequency response to the ideal off-ear frequency response, and employ the difference metric to detect when the headphone cup is disengaged from an ear.

Example 2 includes the signal processor of Example 1, further comprising a feedforward (FF) microphone input to receive a FF signal from a FF microphone outside of the headphone cup, wherein the OED signal processor is further configured to remove a correlated frequency response between the FF signal and the FB signal when determining the received frequency response.

Example 3 includes the signal processor of any of Examples 1-2, wherein the OED signal processor is further configured to determine an audio frequency response of the audio signal times an on-ear transfer function between the headphone speaker and the FB microphone as an ideal on-ear response.

Example 4 includes the signal processor of any of Examples 1-3, wherein the OED signal processor is further configured to normalize the difference metric based on the ideal on-ear response.

Example 5 includes the signal processor of any of Examples 1-4, wherein the difference metric is determined according to:

$$\text{Normalized\_difference\_metric} = \frac{\log\frac{\text{abs(Recieved)}}{\text{abs(Ideal\_off\_ear)}}}{\log\frac{\text{abs(Ideal\_on\_ear)}}{\text{abs(Ideal\_off\_ear)}}}$$

where Received is the received frequency response, Ideal_off_ear is the ideal off-ear frequency response, and Ideal_on_ear is the ideal on-ear response.

Example 6 includes the signal processor of any of Examples 1-5, wherein the difference metric includes a plurality of frequency bins, and the OED signal processor is further configured to weight the frequency bins.

Example 7 includes the signal processor of any of Examples 1-6, wherein the OED signal processor is further configured to determine a difference metric confidence as a sum of frequency bin weights, and employ the difference metric confidence when detecting the headphone cup is disengaged from the ear.

Example 8 includes the signal processor of any of Examples 1-7, wherein the OED signal processor is further configured to determine the headphone cup is engaged when difference metric confidence is above a difference metric confidence threshold and the difference metric is above a difference metric threshold.

Example 9 includes the signal processor of any of Examples 1-8, further comprising a tone generator configured to generate an OED tone at a specified frequency bin to support generation of the difference metric when the audio signal drops below a noise floor.

Example 10 includes the signal processor of any of Examples 1-9, wherein the OED signal processor is further configured to control the tone generator to maintain a ratio of OED tone power to noise-floor tone power with a programmable margin.

Example 11 includes the signal processor of any of Examples 1-10, further comprising: a left feedforward (FF) microphone input to receive a left FF signal from a left FF microphone; and a right FF microphone input to receive a right FF signal from a right FF microphone, wherein the OED signal processor is further configured to select a weaker of the FF signals to determine the noise floor when wind noise is detected in a stronger of the FF signals.

Example 12 includes the signal processor of any of Examples 1-11, wherein the difference metric is averaged over an OED cycle, and the OED signal processor is further configured to determine the headphone cup is disengaged when the average difference metric is above a difference metric threshold.

Example 13 includes the signal processor of any of Examples 1-12, wherein a plurality of difference metrics, including the difference metric, are generated over an OED cycle, and the OED signal processor is further configured to determine the headphone cup is disengaged when a change between difference metrics is greater than a difference metric change threshold.

Example 14 includes the signal processor of any of Examples 1-13, wherein the OED signal processor is further configured to: determine a distortion metric based on a variance of the difference metric over a plurality of frequency bins, and ignore the difference metric when the distortion metric is greater than a distortion threshold.

Example 15 includes the signal processor of any of Examples 1-14, wherein the OED signal processor is further configured to: determine an expected phase of the FB signal based on a phase of the audio signal, and reduce a confidence metric corresponding to the difference metric when a difference in phase of a received frequency response associated with the FB signal and the expected phase of the received frequency response associated with the FB signal is greater than a phase margin.

Example 16 includes a method comprising: employing a tone generator to generate an off-ear detection (OED) tone at a specified frequency bin; injecting the OED tone into an audio signal forwarded to a headphone speaker; detecting a noise floor from a feedforward (FF) microphone signal;

adjusting a volume of the OED tone based on a volume of the noise floor; generating a difference metric by comparing a Feedback (FB) signal from a FB microphone to the audio signal; and employing the difference metric to detect when the headphone cup is disengaged from an ear.

Example 17 includes the method of Example 16, wherein a tone margin is maintained between the volume of the OED tone and the volume of the noise floor.

Example 18 includes the method of any of Examples 16-17, wherein detecting when the headphone cup is disengaged includes determining when the difference metric exceeds a threshold.

Example 19 includes the method of any of Examples 16-18, wherein the difference metric is generated by: determining an audio frequency response of the FB signal over an OED frame as a received frequency response, determining an audio frequency response of the audio signal times an off-ear transfer function between the headphone speaker and the FB microphone as an ideal off-ear response, and generating a difference metric comparing the received frequency response to the ideal off-ear frequency response.

Example 20 includes the method of any of Examples 16-19, wherein the difference metric is determined over a plurality of frequency bins, including the specified frequency bin, and the method further comprises: weighting the frequency bins; determining a difference metric confidence as a sum of frequency bin weights; and employing the difference metric confidence when detecting the headphone cup is disengaged from the ear.

Example 21 includes a computer program product stored in a non-transitory memory that, when executed by a processor, causes a headphone set to perform functionality of any of Examples 1-15 or the method of any of Examples 16-19.

The previously described examples of the disclosed subject matter have many advantages that were either described or would be apparent to a person of ordinary skill. Even so, all of these advantages or features are not required in all versions of the disclosed apparatus, systems, or methods.

Additionally, this written description makes reference to particular features. It is to be understood that the disclosure in this specification includes all possible combinations of those particular features. Where a particular feature is disclosed in the context of a particular aspect or example, that feature can also be used, to the extent possible, in the context of other aspects and examples.

Also, when reference is made in this application to a method having two or more defined steps or operations, the defined steps or operations can be carried out in any order or simultaneously, unless the context excludes those possibilities.

Although specific examples of the disclosure have been illustrated and described for purposes of illustration, it will be understood that various modifications may be made without departing from the spirit and scope of the disclosure. Accordingly, the disclosure should not be limited except as by the appended claims.

What is claimed is:

1. An off-ear detection circuit comprising:

a tone generator configured to inject a tone signal into an audio signal to obtain a combined signal that includes the tone signal and the audio signal, the tone signal within a sub-audible frequency for a user;

a feedback microphone input configured to receive a feedback signal based at least in part on the combined signal; and an off-ear detection processor configured to determine a received frequency response based on the feedback signal, determine a difference metric between the received frequency response and a modeled off-ear frequency response, determine an off-ear state of a device based at least in part on the difference metric, and remove a correlated frequency response between a feedforward signal and the feedback signal to determine the received frequency response.

2. The off-ear detection circuit of claim 1 wherein the tone signal is less than 30 Hz.

3. The off-ear detection circuit of claim 2 wherein the tone signal is between 15 Hz and 30 Hz.

4. The off-ear detection circuit of claim 1 wherein the device is a headphone device.

5. The off-ear detection circuit of claim 1 wherein the off-ear detection processor is further configured to determine a change in the off-ear state of the device based at least in part on the difference metric.

6. The off-ear detection circuit of claim 1 wherein the combined signal is primarily formed from the tone signal.

7. The off-ear detection circuit of claim 1 further comprising a feedforward microphone input configured to receive the feedforward signal from a feedforward microphone external to a portion of the device configured to be on-ear.

8. The off-ear detection circuit of claim 1 wherein the off-ear detection processor is further configured to determine a noise floor based on the feedforward signal, and to cause the tone generator to maintain a volume margin between the tone signal and the noise floor.

9. The off-ear detection circuit of claim 1 further comprising:

a first feedforward microphone input configured to receive the feedforward signal as a first feedforward signal from a first feedforward microphone; and a second feedforward microphone input configured to receive a second feedforward signal from a second feedforward microphone, the first feedforward signal and the second feedforward signal based on ambient noise received at the location of the respective first and second feedforward microphones, the off-ear detection signal processor further configured to determine a noise floor based on a weaker of the first and second feedforward signals.

10. An electronic device comprising:

a speaker configured to output one or more of an audio signal or a tone signal;

a tone generator configured to generate the tone signal, the tone signal within a frequency band that is not audible to a user;

a feedback microphone configured to generate a feedback signal based at least in part on one or more of the audio signal or the tone signal; and an off-ear detection processor configured to determine a received frequency response based on the feedback signal, determine a difference metric between the received frequency response and a modeled off-ear frequency response, determine an off-ear state of the electronic device based at least in part on the difference metric, and remove a correlated frequency response between a feedforward signal and the feedback signal to determine the received frequency response.

11. The electronic device of claim 10 wherein the speaker outputs the tone signal and does not output the audio signal, and the feedback signal is based on the tone signal.

12. The electronic device of claim 10 wherein the tone signal is less than 100 Hz.

13. The electronic device of claim 10 wherein the electronic device is a headphone device and the feedback microphone is located within a portion of the electronic device configured to be on-ear.

14. The electronic device of claim 10 further comprising a feedforward microphone configured to receive the feedforward signal, the feedforward microphone external to a portion of the device configured to be on-ear.

15. The electronic device of claim 10 wherein the off-ear detection processor is further configured to determine a noise floor based on the feedforward signal, and to cause the tone generator to maintain a minimum difference between the tone signal and the noise floor.

16. The electronic device of claim 10 further comprising:

a first feedforward microphone configured to receive the feedforward signal as a first feedforward signal; and a second feedforward microphone configured to receive a second feedforward signal, the first feedforward signal and the second feedforward signal based on ambient noise, the off-ear detection signal processor further configured to determine a noise floor based on a weaker of the first feedforward signal and the second feedforward signal.

17. An electronic device comprising:

a speaker configured to output one or more of an audio signal or a tone signal;

a tone generator configured to generate the tone signal, the tone signal within a frequency band that is not audible to a user, and configured to not generate the tone signal when the audio signal includes particular bass frequencies;

a feedback microphone configured to generate a feedback signal based at least in part on one or more of the audio signal or the tone signal; and an off-ear detection processor configured to determine a received frequency response based on the feedback signal, determine a difference metric between the received frequency response and a modeled off-ear frequency response, and determine an off-ear state of the electronic device based at least in part on the difference metric.

18. A method of device off-ear detection comprising:

generating a tone signal within a frequency band that is not audible to a user;

combining the tone signal with an audio signal to obtain a combined signal;

outputting, via a speaker of a device, the combined signal;

receiving, via a feedback microphone of the device, a feedback signal generated based at least in part on the combined signal;

determining a received frequency response by removing a correlated frequency response between a feedforward signal and the feedback signal;

determining a difference metric between the received frequency response and a modeled off-ear frequency response; and detecting an off-ear state of the device using the difference metric.

19. The method of claim 18 further comprising generating a control signal in response to detecting that a portion of the device configured to be on-ear has transitioned from an on-ear state to the off-ear state, the control signal configured to cause one or more of: a noise cancellation feature of the device to be deactivated; the device to be deactivated; the device to be paused; or a headphone of the device to be deactivated.

20. The method of claim 18 further comprising reducing power consumption of the device when said detecting the off-ear state includes detecting that a portion of the device configured to be on-ear is transitioned from an on-ear state to an off-ear state.

* * * * *